March 10, 1959

R. S. NAROZNY 2,877,441

TERMINAL PIN

Filed April 6, 1955

2 Sheets-Sheet 1

INVENTOR.
Ronald S. Narozny,
BY
Wilkinson, Huxley, Byron + Hume
Attys.

INVENTOR.
Ronald S. Narozny,
BY
Wilkinson, Huxley, Byron & Hume
Attys.

United States Patent Office 2,877,441

Patented Mar. 10, 1959

2,877,441

TERMINAL PIN

Ronald S. Narozny, Chicago, Ill., assignor to Malco Tool & Mfg. Co., Chicago, Ill., a partnership consisting of Al Just and Margaret R. Just Application April 6, 1955, Serial No. 499,615

2 Claims. (Cl. 339—258)

This invention relates to terminal pins that are mounted by insertion into a base board and project from the base board to serve as electrical terminal elements to which wiring leads can be attached.

The terminal pin herein disclosed is particularly suited to electronic or electrical assemblies of the so-called "printed circuit" variety, wherein certain conductive paths are provided by conductive material attached to an insulating base board in a pattern suited to the particular purpose of the circuit, and requiring connection of separate wiring leads at certain points with the conductive material attached to the board. For making such connections, a hole is provided in the board at each point at which a terminal pin connection is to be made, and one of the pins is therein inserted. The pin is so formed that when the board, with mounted pins, is dipped into molten solder, the attachment of the pins to the board becomes rigid, due to the formation of a solder joint between the pin and the conductive material on the board about the hole.

In the past, several operations have been required to securely mount terminal pins to the base board. Besides inserting the pin in holes in the board, a rolling operation has been also necessary to fasten the pin to the board and prevent removal before the soldering step.

One advantageous feature of the pin herein disclosed is related to the problems of ready insertion into the mounting holes, maintenance of the pins with reasonable security after they are so mounted and prior to soldering, and rendering the pin mounted completely secure and the pins rigid in the board by the soldering operation. Another advantageous feature of the pin of this invention is that its formation lends itself to the solution of these problems, while presenting a tubular pin structure into which an end of a wiring lead may be thrust and wherein the latter will be held with reasonable security until the soldering operation has been completed. These two features are interrelated, since the lead retaining action is provided by a gripping effect exerted between a pair of skirts between which the wiring lead is inserted and which it deflects expansively, the skirts while so deflected tending to increase the effectiveness of engagement of locking means carried by the skirts with the plate structure. A further advantageous feature of the terminal pin herein is that it is automatically locked to the board when inserted eliminating any additional steps of rolling to fasten the pin.

Further objects and advantages of this invention will become evident as the description proceeds and from an examination of the accompanying drawing which illustrates one embodiment of the invention and in which similar numerals refer to similar parts throughout the several views.

Figure 1:
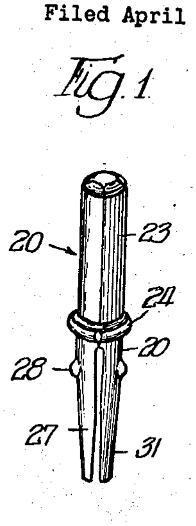
Figure 1 is a perspective view of a terminal pin embodying the present invention.
Figure 2:
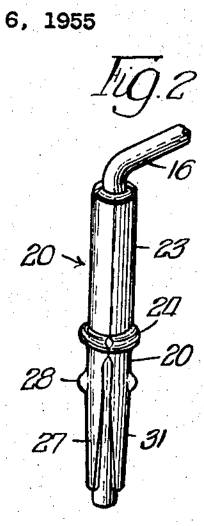
Figure 2 is a perspective view of a terminal pin in accordance with the invention having a wiring lead engaged therein.
Figure 3:
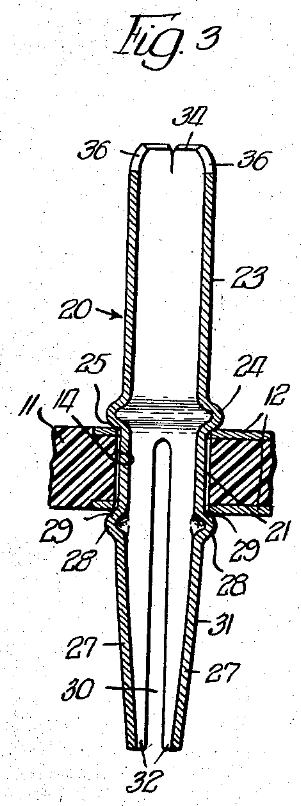
Figure 3 is an enlarged sectional view showing a fragment of a printed circuit base board with a terminal pin mounted therein prior to attachment of a wiring lead, and prior to soldering.

Referring now to the drawings, a terminal pin embodying the invention is indicated generally by reference numeral 20, for mounting in a printed circuit structure. The printed circuit structure, fragmentarily shown in Figures 3 and 4, includes a base board of insulating material having securely attached to one or both surfaces a pattern of electrically conductive material 12, typically metallic copper, providing a system of conductive paths. At a selected point at which wiring lead 16 is to be connected to the conductive material 12, a hole 14 is provided, which penetrates board 11 and, if the base be printed circuit, the conductive material 12. The cross sectional size of hole 14 is somewhat related to the gauge of lead 16, the hole being sufficiently large to provide ready entry to a pin having a mounting portion 21 which in turn is large enough internally to provide free clearance for a lead of the gauge selected. As shown, it is preferable that the hole be large enough to provide clearance for mounting portion 21 of the pin 20.

The pin includes a tail portion 23 extending from one end of the mounting portion 21. Said tail projects upwardly from the base surface when the pin has been mounted. An outwardly struck peripheral bead 24 is interposed between mounting portion 21 and tail 23 of radial extent sufficient to provide a shoulder surface 25 that acts as a positioning stop when the pin is inserted into the hole, and in the event that the base is a printed circuit board, surface 25 establishes electrical contact with conductive material 12 about the hole.

The pin also has a tapered nose 31 formed by a pair of skirts 27. Due to the inward inclination of the skirts, and preferably enhanced by slightly tapering them, the nose 31 is substantially pointed, affording easy initial insertion into base board holes. The skirts each have opposite outwardly struck projections 28 that have stop surfaces 29 facing bead shoulder surface 25 and spaced therefrom a distance that is substantially equal to the preselected thickness of a base or printed circuit board 11. Opposed slots or recesses 30 in the pin wall material separate skirts 27, 27 and extend from ends 32 of the skirts, longitudinally of the pin to a point at least past projections 28, and preferably through a substantial length of the mounting portion 21.

The arrangement so far described provides for ready mounting of the pins by insertion of nose 31 and the skirts 27 into a hole 14. Axial movement of the pin causes the skirts 27 to be deflected toward each other by camming the projections 28 inwardly as they engage the sides of the hole, until bead shoulder 25 contacts the upper base surface. When projections 28 clear the hole, skirts 27 snap outwardly.

Figure 4:
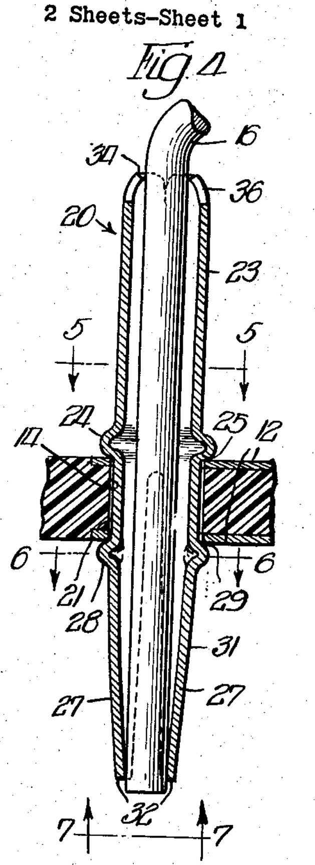
Figure 4 is a view similar to Figure 3, however, showing the terminal pin after insertion of a wiring lead and prior to soldering.
Figure 5:
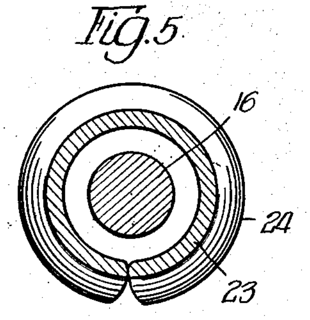
Figure 5 is a view in section taken along line 5—5 of Figure 4.
Figure 6:
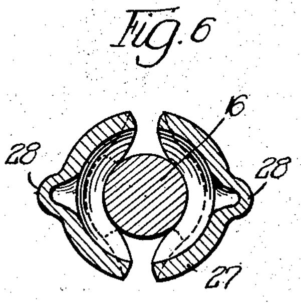
Figure 6 is a view in section taken along line 6—6 of Figure 4.
Figure 7:
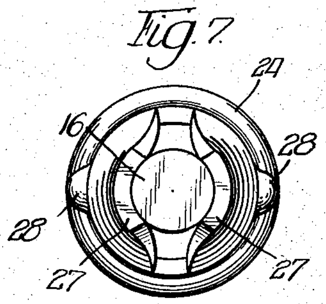
Figure 7 is an end view of a pin from a plane indicated by line 7—7 of Figure 4.

It may be visualized that dipping of the base 11 and mounted pin 20 into molten solder while in the condition of Figure 4, would complete a rigid, strong and permanent assembly, by stiffening of the skirts, coating of wiring lead 16, and in a printed circuit assembly, coating of mounting portion 21 and soldering the surface of shoulder 25 to the conductive material 12.

In addition to this characteristic of lending itself to secure solder-securement of the mounting that arises from the pin structure, the arrangement is such as to provide for adequately secure retention of a wire lead 16 after attachment to the pin, and prior to the soldering operation. The pin, as shown, is tubular and tail 23 has an axial end opening 34, preferably of a size closely corresponding to the size of the lead 16, the tail end having flanges 36 bent inwardly for that purpose. Skirts 27 are inclined inwardly toward each other and toward the adjacent pin end, to an internal spacing, at 32, that is less than the lead 16 diameter. When a wiring lead 16 is axially entered into opening 34 and advanced through the entire pin, it deflects the somewhat resilient skirts 27 outward, whereby said skirts exert upon the lead a gripping action that is light, but sufficient to prevent accidental displacement of the lead during subsequent phases of a multiple lead wiring operation or during soldering. Outward deflection of skirts 27 also tends to reinforce the retention of the pin in the hole effected by projections 28, by increasing resistance of skirts 27 and the projections 28 to inward deflection.

It will be seen that when a mounted pin with inserted conductor, as in Figure 4, is dipped in molten solder, the same solder-reinforcements and attachment will be formed as in the case of the unwired pin, but with the additional security afforded by the lead between the skirt ends. Also, the lead 16 will be securely soldered to the internal pin wall surface, the slots 30 affording entrance for it.

Figure 8:
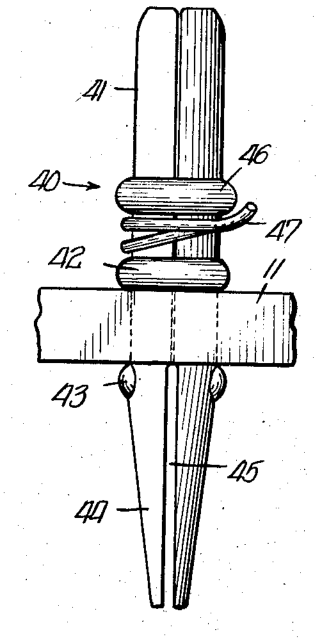
Figure 8 shows a modified form of terminal pin.

A modified form of terminal pin is shown in Figure 8, mounted in a baseboard 11. This terminal pin 40 is similar to the one previously described, having a tail portion 41 projecting upwardly above the board and a bead 42 for abutting the upper surface of the board. Pin 40 has projections 43 for engaging the bottom surface of the board, mounted on skirts 44 separated by a pair of slots 45. Terminal pin 40, is provided with an additional shoulder or bead 46 providing a stop so that a wire 47 may be wrapped around without slipping off the tail portion 41.

Figure 9:
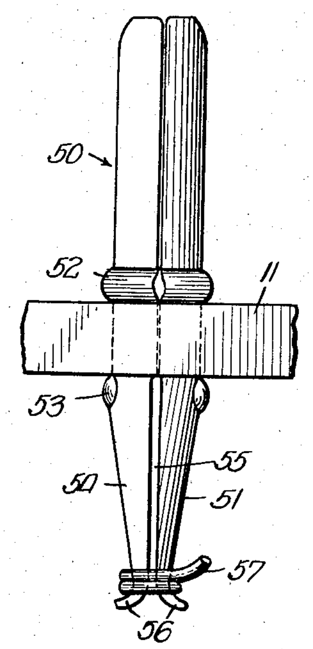
Figure 9 shows another form of terminal pin.

In Figure 9 is shown another form of terminal pin similar to the terminal pin previously described in Figures 1 to 7. This terminal pin 50 has a bead 52 for engaging the upper surface of a board 11 and projections 53 mounted on skirts 54 separated by slots 55 for abutting the bottom surface of the board 11. As in the previous terminal pins, the pin 50 has a tapered nose 51. However, the ends 56 of skirts 54 are bent outwardly to form shoulders 56 so that a wire conductor 57 may be wrapped around the nose 51 of the pin. This form of terminal pin permits a wire wrap, prevents removal, and holds the same in fixed position for easy soldering.

Figure 10:
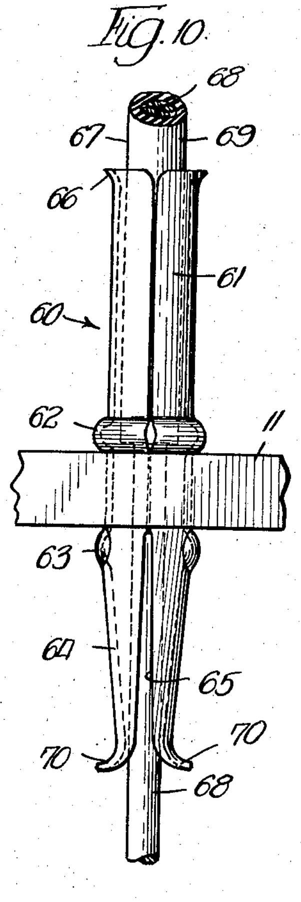
Figure 10 shows still another form of terminal pin.

In Figure 10 is shown another modified form of terminal pin similar to the one described in Figures 1 through 7. This terminal pin 60 is adapted to be mounted in a board 11 and prevented from removal by a bead 62 above the top surface of the board and projections 63 on skirts 64 separated by slots 65 below the bottom surface of the board. However, in the pin 60 shown in Figure 10, the tail portion 61 has an open end 66 flanged outwardly for permitting the insertion of a stripped lead 67. As shown in this figure, lead 67 is provided with a conducting wire 68 surrounded by insulating material 69. The flanged open end of tail portion 61 permits the insertion of the insulation part way into the terminal pin. The wiring lead is stripped of insulating material for a distance sufficient to permit the conducting wire to project below the lower surface of board 11 and be contained between skirts 64. The ends of 70 of the skirts 64 may be bent outwardly, as shown, to provide shoulders for a wrapped wire connection.

In the drawing and specification there have been set forth several embodiments of the invention, and although specific terms are employed, they are used in a generic and descriptive sense only and not for purposes of limitation. Changes in form and in the proportion of parts, as well as the substitution of equivalents are contemplated, as circumstances may suggest or render expedient, without departing from the spirit or scope of this invention as further defined in the following claims.

I claim:

1. A terminal pin for mounting in a base of preselected thickness and in a hole of preselected cross section, said terminal pin comprising a tubular metal element having a tail portion, a mounting portion and a nose portion, said mounting portion having an external cross section substantially corresponding to the hole cross section, said nose portion being of greater length than said mounting portion and having its external surface gradually tapered from the cross section of said mounting portion to a cross section substantially less than said hole cross section, an outwardly struck bead interposed between said tail portion and mounting portion providing a shoulder for contact with the base surface surrounding the hole wherein the mounting portion is inserted, said mounting portion having a pair of opposite outwardly struck rounded projections having base surface contacting margins facing said bead and spaced therefrom at a distance substantially equal to said base thickness, said projections having outward end portions spaced apart a distance greater than the distance across the hole in said base, and a pair of slots extending from the nose end of said terminal pin to a substantial distance beyond said projections, said slots being of sufficient width to permit contraction of the cross section of said mounting and nose portions to permit said projections to pass through the hole in said base, whereby said terminal pin may be snapped in and resiliently held in said base hole.

2. A terminal pin according to claim 1 wherein the outer end of said tail portion is provided with an axial opening having a cross section substantially matching the preselected cross section of a wiring lead that is to be inserted therein, and wherein said tubular member is tapered internally between said projections and the nose end in a manner corresponding to the gradually tapered external surface to an internal cross section at the nose end smaller than the cross section of said tail portion opening, whereby said mounting portion and said nose portion are expandable by axial insertion of said wiring lead into said opening and through said tubular element to increase the engagement force between said projections and said base.

References Cited in the file of this patent

UNITED STATES PATENTS

| | | |
|---|---|---|
| 2,037,620 | Dewhurst et al. | Apr. 14, 1936 |
| 2,215,366 | Alden | Sept. 17, 1940 |
| 2,340,703 | Schwabacher | Feb. 1, 1944 |
| 2,517,677 | Kjell-Berger et al. | Aug. 8, 1950 |
| 2,542,144 | Kearns | Feb. 20, 1951 |
| 2,631,184 | Sampson | Mar. 10, 1953 |
| 2,673,336 | Peters | Mar. 23, 1954 |
| 2,689,337 | Burtt et al. | Sept. 14, 1954 |
| 2,747,169 | Johanson | May 22, 1956 |